(12) United States Patent
Jiang et al.

(10) Patent No.: US 6,757,176 B1
(45) Date of Patent: Jun. 29, 2004

(54) CIRCUIT BOARD

(75) Inventors: Tongbi Jiang, Boise, ID (US); Yong Du, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/643,526

(22) Filed: Aug. 22, 2000

(51) Int. Cl.[7] .................................................. H05K 1/14
(52) U.S. Cl. ........................ 361/784; 361/760; 361/720; 361/748
(58) Field of Search ................................. 361/784, 761, 361/762, 765, 771, 793, 795, 720, 748, 750, 812, 736; 428/901

(56) References Cited

U.S. PATENT DOCUMENTS 2,695,351 A * 11/1954 Beck ........................... 174/258
3,617,613 A * 11/1971 Benzinger et al. ........... 156/299
4,886,699 A * 12/1989 Carroll et al. ................ 174/256
6,127,728 A * 10/2000 Juneja et al. ................. 257/700

* cited by examiner

Primary Examiner—Randy W. Gibson
Assistant Examiner—Hung Bui
(74) Attorney, Agent, or Firm—Schwegman, Lundberg, Woessner & Kluth, P.A.

(57) ABSTRACT

This invention relates to circuit boards and methods of fabricating circuit boards. A circuit board includes a core layer and a surface layer. The core layer includes a number of fibers and the surface layer has a thickness that is between about 10% and about 30% of the circuit board thickness. Including fibers in the core layer increases the strength of the circuit board. The surface layer is essentially free of fibers and relatively thick. The thickness of the surface layer inhibits the formation of cracks in the circuit board, which improves the reliability of circuits and systems coupled to the circuit board.

25 Claims, 4 Drawing Sheets

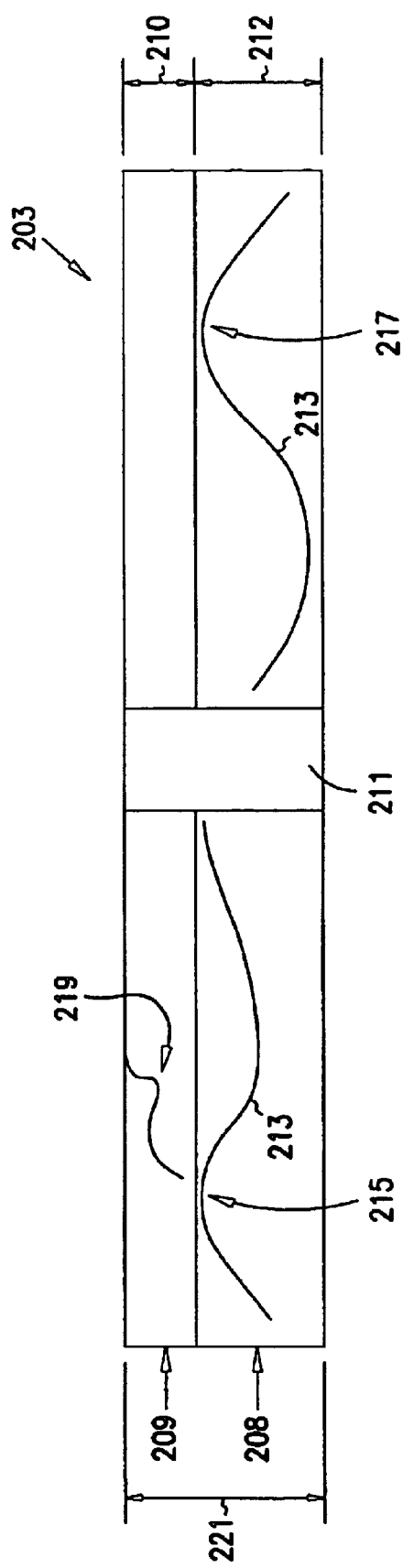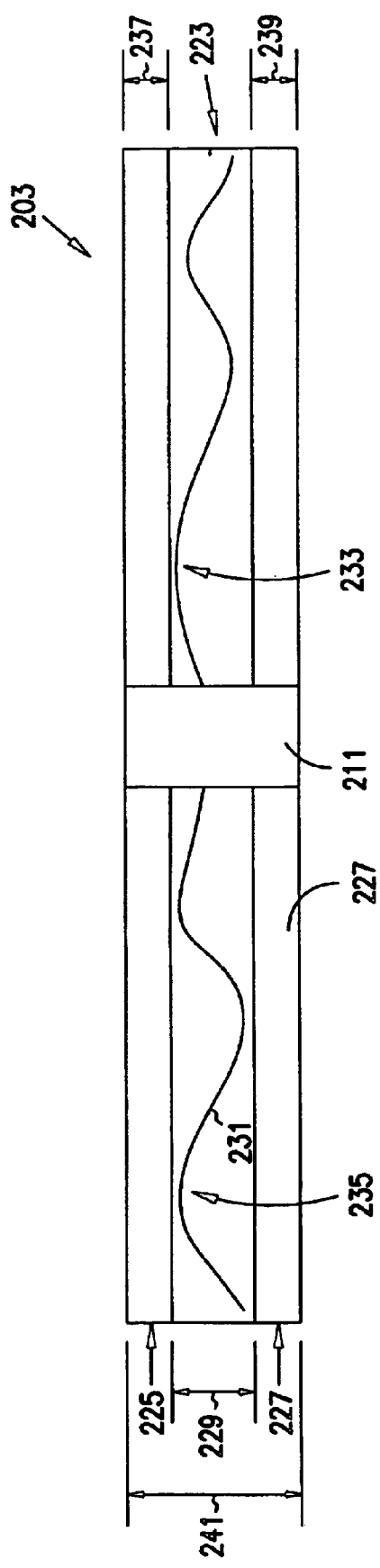

CIRCUIT BOARD

FIELD OF THE INVENTION

This invention relates to circuit boards, and more particularly, to increasing circuit board reliability.

BACKGROUND OF THE INVENTION

Printed circuit boards, which are used in the manufacture of electrical, mechanical, electro-mechanical, and other kinds of products, provide a substrate for mounting a die on which integrated circuits, such as processors, memories, and amplifiers, are fabricated. FIG. 1 shows a cross-sectional view of a prior art ball-grid array (BGA) package 100 which includes printed circuit board 103 coupled to board 105 by solder balls 107, and die 109 coupled to printed circuit board 103 by adhesive 111 and molding compound 112.

A longstanding and unsolved problem with printed circuit boards in general and with BGA package 100 in particular is that printed circuit board 100 may develop a crack, such as crack 113. Crack 113 destroys the structural integrity of BGA package 100. Once the structural integrity of BGA package 100 is destroyed, unforseen stresses may break or damage electronic connectors, such as electronic connectors 115 and 116, and as a result, any product in which BGA package 100 is incorporated may malfunction.

One method of solving problems associated with printed circuit board cracking and the resulting electronic connection failures is to include a second printed circuit board in the design of an electronic system. The second circuit board is a redundant printed circuit board which mirrors the operation of the primary board, so a system failure occurs only when both the redundant printed circuit board and the primary board fail at the same time. Unfortunately, this solution is very expensive and is cost effective only in systems, such as trains, airplanes, or spacecraft, where the cost of failure is high. For systems in which the cost of failure is low, redundant circuit boards are seldom used.

For these and other reasons there is a need for the present invention.

SUMMARY OF THE INVENTION

The above mentioned problems with cracking in circuit boards and other problems are addressed by the present invention and will be understood by reading and studying the following specification. A circuit board is described that includes embedded fibers, which strengthen the board, and a surface layer having a certain thickness range that inhibits the formation of cracks in the circuit board.

The present invention provides, in one embodiment, a circuit board including a core layer and a surface layer. A number of fibers are embedded in the core layer. The surface layer has a thickness which is between about 10% and about 30% of the circuit board thickness. Embedding fibers in the core layer increases the strength of the circuit board. A surface layer thickness of between about 10% and about 30% of the circuit board thickness inhibits the formation of cracks in the circuit board, which improves the reliability of circuits mounted on the circuit board and systems in which the circuit board is embedded.

In an alternate embodiment, the present invention provides a method of fabricating a circuit board having a circuit board thickness. The method includes forming a core layer including a number of fibers, and forming a surface layer on the core layer. The surface layer has a surface layer thickness that is between about 10% and about 30% of the circuit board thickness and is free of fibers.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIG. 2B is a cross-sectional view of an alternate embodiment of a circuit board assembly according to the teaching of the present invention.

FIG. 2C is a cross-sectional view of a second alternate embodiment of a circuit board assembly according to the teaching of the present invention.

DETAILED DESCRIPTION

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1:
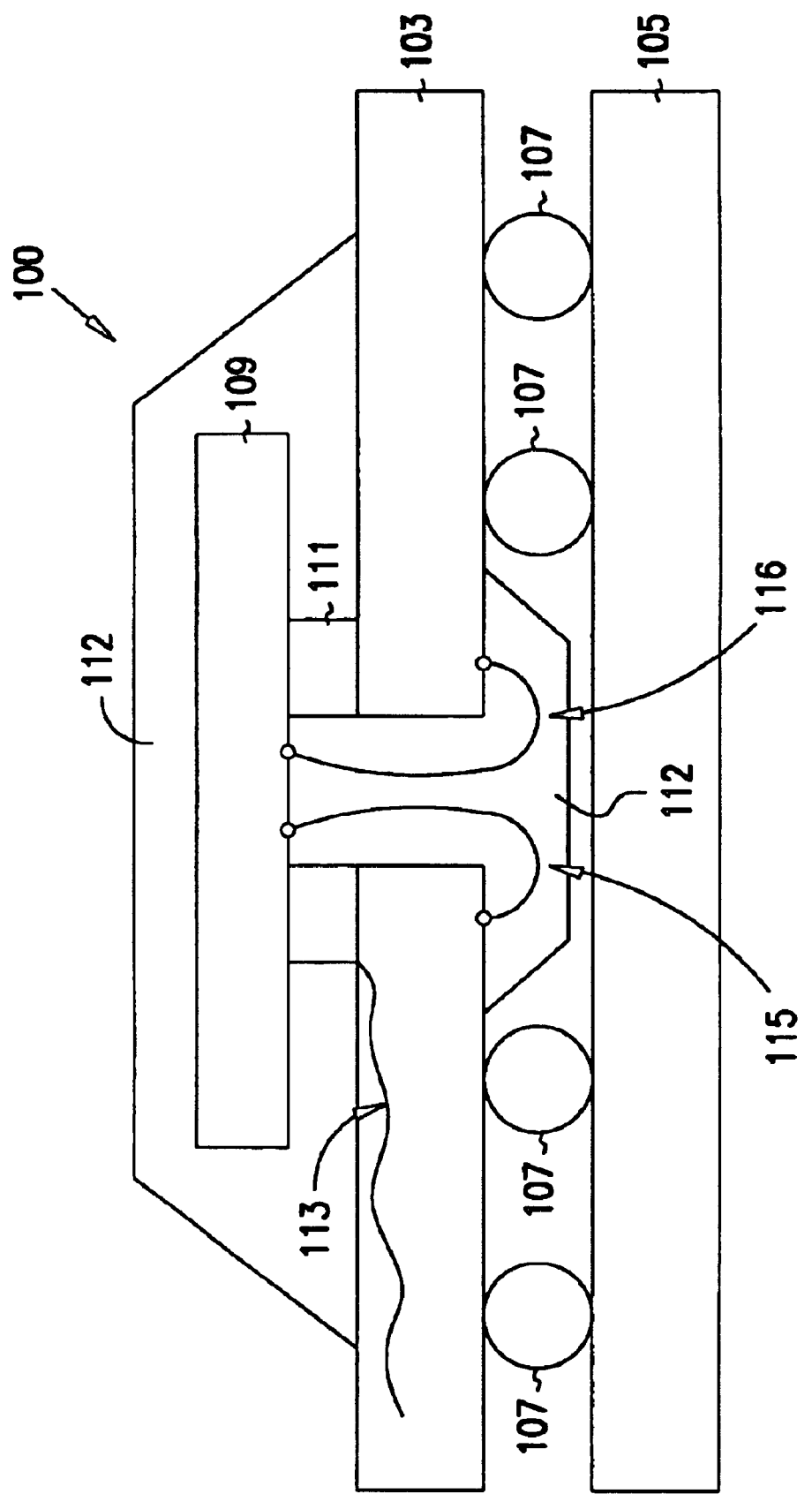
FIG. 1 is an illustration cross-sectional view of a prior art ball-grid array (BGA) package including a circuit board.
Figure 2A:
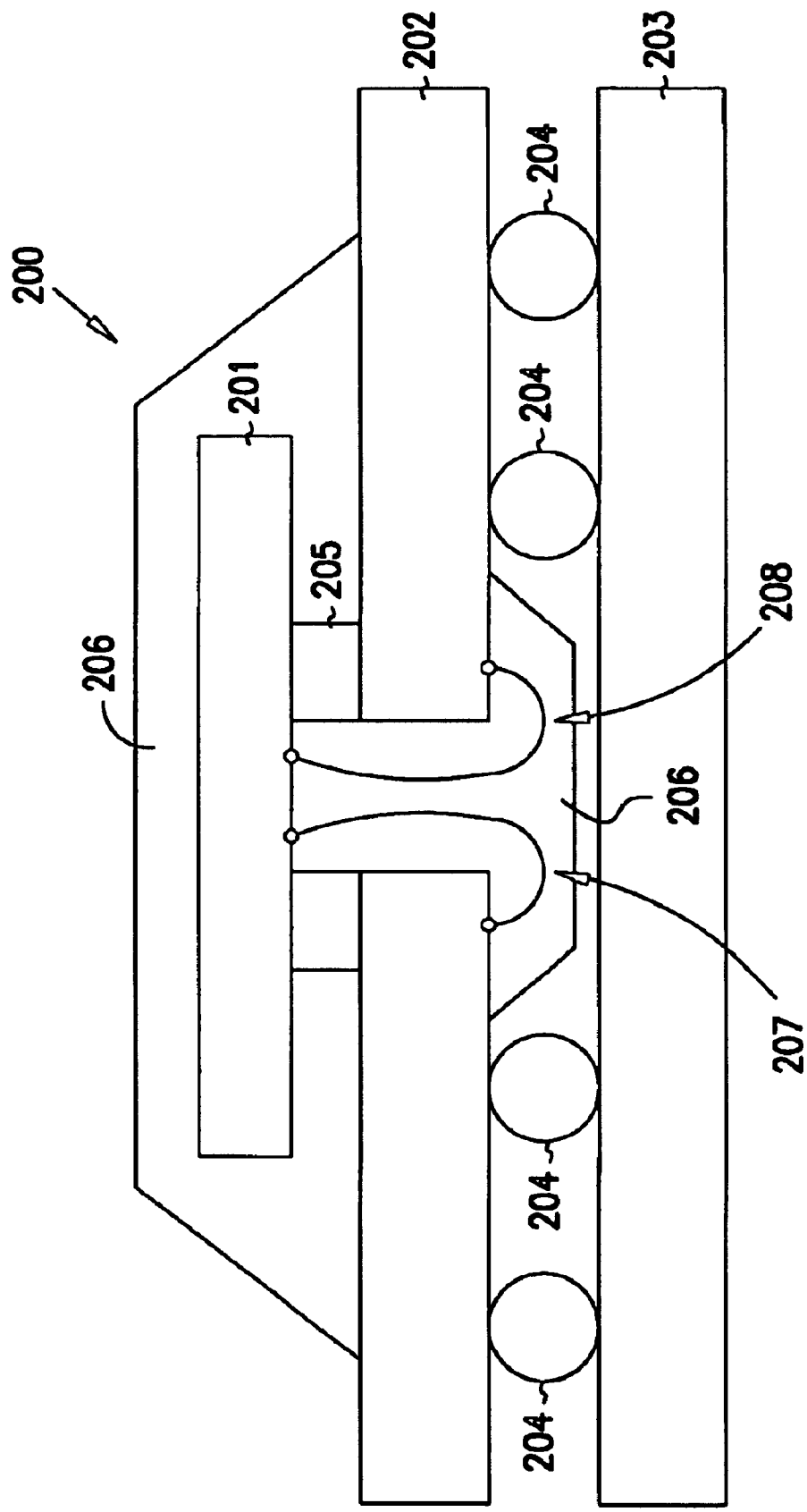
FIG. 2A is a cross-sectional view of one embodiment of a circuit board assembly according to the teaching of the present invention.

FIG. 2A is a cross-sectional view of one embodiment of circuit board assembly 200. Circuit board assembly 200 includes die 201, printed circuit board 202, and board 203. Circuit board 202 is coupled to board 203 by solder balls 204, and die 201 is coupled to printed circuit board 202 by adhesive 205 and molding compound 206.

Circuit board assembly 200 is sometimes referred to as a ball-grid array, but the present invention is not limited to ball-grid array circuit board assemblies. Any circuit board assembly that includes a circuit board, such as printed circuit board 202, which is described in more detail below, is suitable for use in connection with the present invention. For example, a circuit board assembly in which a first circuit board is coupled by edge connectors to a second circuit board is suitable for use in connection with the present invention.

Die 201 includes an integrated circuit, such as a memory circuit, a processor, an amplifier, or an application specific circuit (ASIC). Memory circuits suitable for use in connection with the present invention include but are not limited to dynamic random access memory (DRAM) circuits, static random access memory (SRAM) circuits, erasable programmable memory (EPROM) circuits, and electrically erasable programmable memory (EEPROM) circuits. Processor circuits suitable for use in connection with the present invention include but are not limited to microprocessors, digital signal processors (DSPs), and reduced instruction set computing (RISC) processors. Amplifier circuits suitable for use in connection with the present invention include but are not limited to operational amplifiers, differential amplifiers, and power amplifiers. Application specific integrated circuits (ASICs) suitable for use in connection with the present invention include telecommunication circuits, such as telecommunication interface circuits. Die 201 is coupled to printed circuit board 202 by adhesive 205, which is selected to maintain a low stress interface between die 201 and circuit board 202. Any adhesive that has a coefficient of thermal expansion which maintains a low stress interface between die 201 and circuit board 202 during the heating and cooling of circuit board assembly 200 is suitable for use in connection with the present invention.

A board 203, such as a circuit board, provides a substrate for mounting a number of circuit boards, such as circuit board 202, and other electronic or electro-mechanical components. In one embodiment, board 203 is a computer system circuit board including a processor. Board 203 may also provide a substrate suitable for securing circuit assembly 200 to a larger package or other housing, such as a cabinet or case. Board 203 is fabricated from materials commonly used in the fabrication of circuit boards, such as polymeric composite materials. One example of a polymeric composite material is phenolic. However, board 203 is not limited to polymeric composite materials, and other materials, particularly insulating materials, may also be used in the fabrication of board 203.

Solder balls 204 provide a number of signal paths to electronically couple circuit board 202 to board 203. The number of signal paths permit communication between components mounted on circuit board 202 and on board 203. Any material that is a good conductor is suitable for use in fabricating solder balls 204. Tin, gold, copper, silver, and alloys of tin, gold, copper, and silver, are examples of materials suitable for use fabricating solder balls 204.

Circuit board 202, as shown in FIG. 2A, provides a substrate for mounting die 201 and coupling signals to board 203. In one embodiment, circuit board 202 is formed from a polymeric composite material. Circuit board 202 is coupled to die 201 by adhesive 205.

FIG. 2B is a detailed cross-sectional view of one embodiment of circuit board 202. In this embodiment, circuit board 202 includes core layer 208 and surface layer 209, which is a first layer or a first resin layer. Circuit board 202 may also include slot 211 for routing conductive connectors, such as conductive connectors 207 and 208 shown in FIG. 2A, from above circuit board 202 to below circuit board 202.

Core layer 208 includes one or more fibers 213 embedded in an insulator. Core layer 208, in one embodiment, is fabricated from a resin and has a thickness 212 of between about 0.006 inches and about 0.012 inches. The one or more fibers 213, in one embodiment, are glass fibers having a diameter of between about 0.0005 inches and about 0.001 inches. In an alternate embodiment, the one or more fibers 213 are woven fibers, such as woven glass fibers, and have a diameter of between about 0.001 inches and about 0.002 inches.

Surface layer 209, in one embodiment, is fabricated from a resin that is free of fibers. In an alternate embodiment, surface layer 209 is fabricated from a resin that is essentially free of fibers. Surface layer 209 is essentially free of fibers when any fibers embedded in surface layer 209 do not significantly increase the likelihood of cracking in circuit board 202. The inventors discovered that cracks in circuit board 202 frequently occur on the surface of circuit board 202 at stress concentration points located above fiber hills, such as fiber hills 215 and 217, and that cracks are less likely to occur at stress concentration points located above fiber valleys. In board assembly 200, stress concentration points occur along an edge of an interface between two surfaces, such as along the edge of adhesive 205 at the interface between adhesive 205 and circuit board 202, as shown in FIG. 2A. The inventors also discovered that cracks at stress concentration points were most likely to occur during the solder reflow process, when temperature gradients are formed in board assembly 200. Once a surface crack, such as surface crack 219 intersects with a fiber, such as the one or more fibers 213, the crack proceeds along the interfacial interface between the one or more fibers 213 and the material in which the one or more fibers 213 is embedded. According to the teachings of the present invention, the inventors also discovered that by increasing thickness 210 of surface layer 209 to between about 10% and 30% of circuit board thickness 221, the likelihood of crack formation on the surface of circuit board 202 is decreased. Therefore, in the novel circuit board of the present invention, the thickness 210 is preferably between about 10% and about 30% of circuit board thickness 221.

FIG. 2C is a detailed cross-sectional view of an alternate embodiment of circuit board 202. In this embodiment, circuit board 202 includes core layer 223, first surface layer 225, and second surface layer 227. Core layer 223 is located between first surface layer 225 and second surface layer 227.

Core layer 223 includes one or more fibers 231 embedded in core layer 223. Core layer 223, in one embodiment, is fabricated from a resin and has a thickness 229 of between about 0.006 inches and about 0.012 inches. Core layer 223 also has greater mechanical strength than first surface layer 225 or second surface layer 227. The one or more fibers 231, in one embodiment, embedded in core layer 223, are glass fibers having a diameter of between about 0.0005 inches and about 0.001 inches. In an alternate embodiment, the one or more fibers 231 are woven fibers, such as woven glass fibers, and have a diameter of between about 0.001 inches and about 0.002 inches.

First and second surface layers 225 and 227, in one embodiment, are fabricated from a resin that is free of fibers. In an alternate embodiment, first and second surface layers 225 and 227 are fabricated from a resin that is essentially free of fibers. First and second surface layers 225 and 227 are essentially free of fibers when any fibers embedded in first and second surface layers 225 and 227 do not significantly increase the likelihood of cracking in circuit board 202. The inventors, in addition to discovering the source of cracks in circuit boards having a single surface layer, have also discovered that cracks in a circuit board having two surface layers, such as circuit board 202 shown in FIG. 2C, frequently occur on one of the surfaces of circuit board 202 at stress concentration points located above fiber hills, such as fiber hills 233 and 235, and that cracks are less likely to occur at stress concentration points located above fiber valleys. In board assembly 200, which is shown in FIG. 2A, stress concentration points occur along an edge of an interface between two surfaces, such as along the edge of adhesive 205 at the interface between adhesive 205 and circuit board 202. The inventors also discovered that cracks at stress concentration points were most likely to occur during the solder reflow process when temperature gradients are being formed in board assembly 200. Referring again to FIG. 2C, once a surface crack intersects a fiber, such as one of the number of fibers 231, the crack proceeds along the interfacial interface between one of the number of fibers 231 and the material in which one of the number of fibers 235 is embedded. The inventors also discovered that by increasing the thickness 237 of surface layer 225 to between about 10% and 15% of circuit board thickness 241 and the thickness 239 of surface layer 227 to between about 10% and 15% of circuit board thickness 241, the likelihood of crack formation on the surface of circuit board 202 is decreased. Therefore, first surface layer thickness 237 is preferably between about 10% and about 15% of circuit board thickness 241 and second surface layer thickness 239 are preferably between about 10% and about 15% of circuit board thickness 241.

Figure 3:
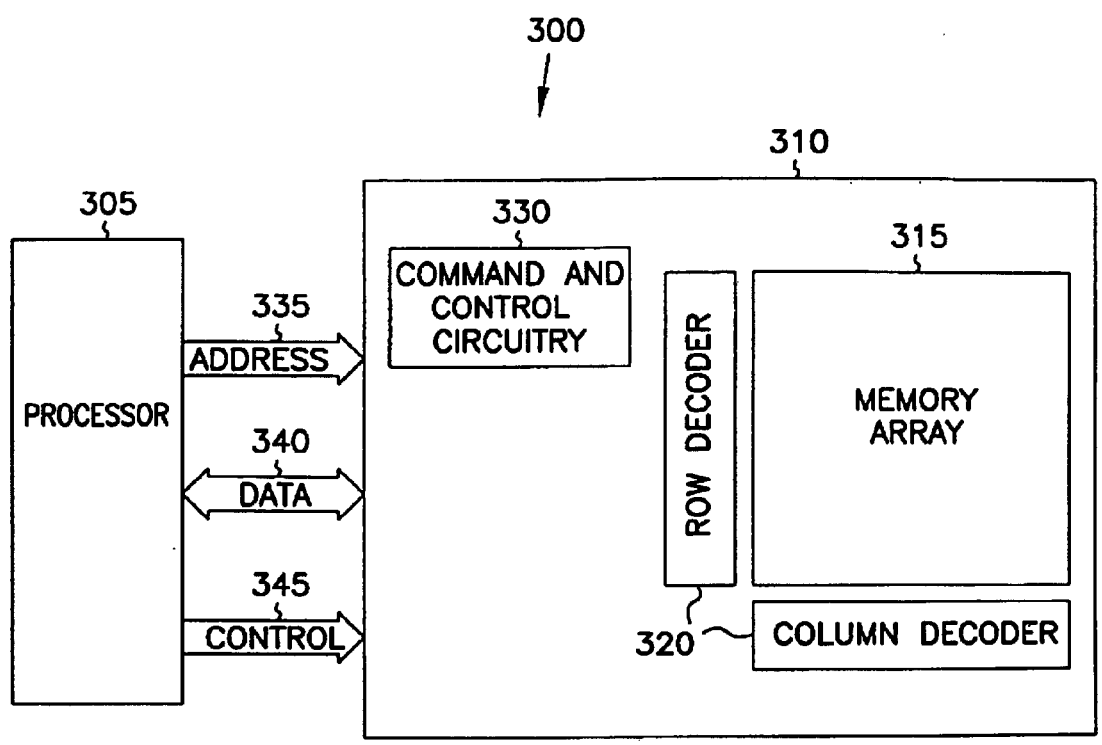
FIG. 3 is a block diagram of one embodiment of a computer system suitable for use in connection with the present invention.

FIG. 3 is a block diagram of one embodiment of a computer system 300 suitable for use in connection with the present invention. System 300 comprises processor 305 and memory board assembly 310 including one or more circuit boards shown in FIGS. 2B and 2C according to the teachings of the present invention. Memory board assembly 310 comprises memory array 315, address circuitry 320, and read circuitry 330, and is coupled to processor 305 by address bus 335, data bus 340, and control bus 345. Processor 305, through address bus 335, data bus 340, and control bus 345 communicates with memory board assembly 310. In a read operation initiated by processor 305, address information, data information, and control information are provided to memory board assembly 310 through busses 335, 340, and 345. This information is decoded by addressing circuitry 320, including a row decoder and a column decoder, and read circuitry 330. Successful completion of the read operation results in information from memory array 315 being communicated to processor 305 over data bus 340.

Conclusion

A number of circuit boards, circuit board assemblies, and methods of fabricating circuit boards and circuit board assemblies have been described. The circuit boards include a number of layers including a core layer and one or more surface layers. The core layer includes a number of embedded fibers to increase the strength of the core layer. Cracking is reduced in the surface layer or layers by fabricating the surface layers with a thickness sufficient to reduce the probability of stress concentration points inducing cracks during the heating and cooling of the circuit board. The methods described for fabricating a circuit board include forming a core layer including a number of fibers, and forming a surface layer on the core layer, such that the surface layer is free of fibers and has thickness that is between about 10% and 30% of the circuit board thickness. Cracking is reduced in the surface layer or layers of circuit boards fabricated using the methods of the present invention.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A circuit board having a circuit board thickness, the circuit board comprising:

a core layer including one or more fibers; and a surface layer having a surface layer thickness that is between about 10% and about 30% of the circuit board thickness, the surface layer being free of fibers.

2. The circuit board of claim 1, wherein the core layer is fabricated from a resin in which the one or more fibers are embedded.

3. The circuit board of claim 1, wherein at least one of the one or more fibers comprises a glass fiber.

4. A circuit board having a circuit board thickness, the circuit board comprising:

a core layer including a number of fibers; and a surface resin layer having a surface layer thickness that is between about 10% and about 30% of the circuit board thickness, the surface resin layer being essentially free of fibers.

5. The circuit board of claim 4, wherein the core layer is a polymeric composite material.

6. The circuit board of claim 4, wherein the core layer has a thickness of between about 0.006 inches and 0.012 inches.

7. A circuit board having a circuit board thickness, the circuit board comprising:

a first layer having a first layer thickness that is between about 10% to 15% of the circuit board thickness, the first layer being free of fibers;

a second layer having a second layer thickness that is between about 10% to 15% of the circuit board thickness; and a core layer located between the first layer and the second layer, the core layer including a number of fibers.

8. The circuit board of claim 7, wherein the core layer has greater mechanical strength than the first layer.

9. The circuit board of claim 7, wherein the core layer has greater mechanical strength than the second layer.

10. A circuit board having a circuit board thickness, the circuit board comprising:

a first resin layer having a first layer thickness that is between about 10% and about 15% of the circuit board thickness, the first resin layer being free of fibers;

a second resin layer having a second layer thickness that is between about 10% and about 15% of the circuit board thickness; and a core layer located between the first resin layer and the second resin layer, the core layer including a number of fibers.

11. The circuit board of claim 10, wherein the first resin layer is free of fibers.

12. The circuit board of claim 11, wherein the second resin layer is free of fibers.

13. A circuit board assembly comprising:

a first circuit board;

a second circuit board coupled to the first circuit board, the second circuit board having a thickness and including a number of fibers having a fiber thickness of between about 0.001 inches and about 0.002 inches, the second circuit board having a surface located at a distance of between about 10% to 20% of the thickness away from the number of fibers; and a die coupled to the second circuit board.

14. The circuit board assembly of claim 13, wherein the die includes a dynamic random access memory (DRAM).

15. The circuit board assembly of claim 13, wherein the die includes a processor.

16. A circuit board assembly comprising:

a first circuit board;

a second circuit board coupled to the first circuit board, the second circuit board having a thickness and including a number of fibers having a fiber thickness of between about 0.001 inches and about 0.002 inches, the second circuit board having a surface located at a distance of between about 10% and about 30% of the thickness away from the number of fibers; and a die coupled to the second circuit board.

17. The circuit board assembly of claim 16, wherein the die includes an amplifier.

18. The circuit board assembly of claim 16, wherein the die includes an application specific integrated circuit (ASIC).

19. A circuit board assembly comprising:

a first circuit board;

a second circuit board coupled to the first circuit board, the second circuit board comprising:
  a core layer including a number of fibers; and
  a surface layer having a surface layer thickness that is between about 10% and about 30% of the circuit board thickness, the surface layer being free of fibers; and a die coupled to the second circuit board.

20. A circuit board assembly comprising:

a first circuit board;

a second circuit board coupled to the first circuit board, the second circuit board comprising:
  a core layer including a number of fibers; and
  a surface layer having a surface layer thickness that is between about 10% and about 30% of the circuit board thickness, the surface layer being free of fibers; and a die coupled to the second circuit board, The circuit board assembly of claim 19, wherein the second circuit board has a thickness and includes a number of fibers having a fiber thickness of between about 0.001 inches and about 0.002 inches, the second circuit board has a surface located at a distance of between about 10% and 30% of the thickness away from the number of fibers.

21. A circuit board assembly comprising:

a first circuit board;

a second circuit board coupled to the first circuit board, the second circuit board having a thickness and including a number of fibers having a fiber thickness of between about 0.001 inches and about 0.002 inches, the second circuit board having a first surface located at a first distance of between about 10% to 15% of the thickness away from the number of fibers and a second surface located at a second distance of between about 10% to 15% of the thickness away from the number of fibers; and a die coupled to the second circuit board.

22. The circuit board assembly of claim 21, wherein the first circuit board is a computer system circuit board.

23. The circuit board assembly of claim 21, wherein the second circuit board is a memory circuit board.

24. A circuit board assembly comprising:

a first circuit board;

a second circuit board coupled to the first circuit board, the second circuit board having a thickness, the second circuit board having a first surface located at a first distance of between about 10% and about 15% of the thickness away from a number of fibers and a second surface located at a second distance of between about 10% and about 15% of the thickness away from the number of fibers; and a die coupled to the second circuit board.

25. The circuit board assembly of claim 24, wherein the die is coupled to the second circuit board by an adhesive.

* * * * *

UNITED STATES PATENT AND TRADEMARK OFFICE
CERTIFICATE OF CORRECTION

PATENT NO.    : 6,757,176 B1  
DATED         : June 29, 2004  
INVENTOR(S)   : Jiang et al.

Page 1 of 1

It is certified that error appears in the above-identified patent and that said Letters Patent is hereby corrected as shown below:

Column 7,
Lines 34-35, delete "The circuit board assembly of claim 19,".

Signed and Sealed this

Seventh Day of June, 2005

JON W. DUDAS
*Director of the United States Patent and Trademark Office*